United States Patent  
Nakayama

(10) Patent No.: US 8,643,025 B2
(45) Date of Patent: Feb. 4, 2014

(54) SEMICONDUCTOR DEVICE AND METHOD OF MANUFACTURING SAME

(75) Inventor: Tatsuo Nakayama, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 9 days.

(21) Appl. No.: 13/477,498

(22) Filed: May 22, 2012

(65) Prior Publication Data

US 2012/0319165 A1    Dec. 20, 2012

(30) Foreign Application Priority Data

Jun. 16, 2011    (JP) .................................. 2011-134270

(51) Int. Cl.
*H01L 29/78*    (2006.01)

(52) U.S. Cl.
USPC ............................................................ 257/76

(58) Field of Classification Search
USPC ......... 257/76–78, 192, 493, 288; 438/29, 270
See application file for complete search history.

(56) References Cited

U.S. PATENT DOCUMENTS

| | | | | |
|---|---|---|---|---|
| 6,020,600 A * | 2/2000 | Miyajima et al. | ................ | 257/76 |
| 6,025,233 A * | 2/2000 | Terasawa | ...................... | 438/270 |
| 6,051,849 A * | 4/2000 | Davis et al. | .................... | 257/103 |
| 7,326,995 B2 * | 2/2008 | Darwish et al. | ................ | 257/330 |
| 7,405,452 B2 * | 7/2008 | Yilmaz | .......................... | 257/409 |
| 7,411,266 B2 * | 8/2008 | Tu et al. | ......................... | 257/492 |
| 7,436,023 B2 * | 10/2008 | Hirler et al. | .................... | 257/328 |
| 7,476,931 B2 * | 1/2009 | Schmidt | ......................... | 257/328 |
| 7,489,011 B2 * | 2/2009 | Yilmaz | .......................... | 257/409 |
| 7,915,617 B2 * | 3/2011 | Ogura et al. | ..................... | 257/77 |
| 7,915,704 B2 * | 3/2011 | Lin et al. | ........................ | 257/476 |

FOREIGN PATENT DOCUMENTS

JP    2010-109086    5/2010

* cited by examiner

*Primary Examiner* — Nathan Ha
(74) *Attorney, Agent, or Firm* — Young & Thompson

(57) ABSTRACT

Object of the invention is to reduce the on resistance between source and drain of a nitride semiconductor device. Between a nitride semiconductor layer lying between source and drain regions and a nitride semiconductor layer serving as an underlying layer, formed is a material having an electron affinity greater than that of these nitride semiconductor layers and having a lattice constant greater than that of the nitride semiconductor layer serving as an underlying layer. As a result, an electron density distribution of a channel formed below a gate insulating film and that of a two-dimensional electron gas formed in a region other than the gate portion, when a gate voltage is applied, can be made closer in the depth direction, leading to reduction in on resistance.

18 Claims, 7 Drawing Sheets

SEMICONDUCTOR DEVICE AND METHOD OF MANUFACTURING SAME

CROSS-REFERENCE TO RELATED APPLICATIONS

The disclosure of Japanese Patent Application No. 2011-134270 filed on Jun. 16, 2011 including the specification, drawings and abstract is incorporated herein by reference in its entirety.

BACKGROUND

The present invention relates to a semiconductor device, in particular, to a normally-off type MIS field effect transistor using a nitride semiconductor and a method of manufacturing the device.

Power semiconductor elements are used in power electronics semiconductor devices or high-frequency amplifiers. Power semiconductor elements are required to have low on resistance and high withstand voltage operation. To achieve such electrical properties, a nitride semiconductor having a greater band gap is used as an element material instead of conventionally used silicon. For example, Japanese Patent Laid-Open No. 2010-109086 discloses a nitride semiconductor element equipped with a first semiconductor layer of a p type nitride semiconductor, a second semiconductor layer of an undoped nitride semiconductor provided on the first semiconductor layer, a third semiconductor layer of an undoped or n-type nitride semiconductor provided selectively on the second semiconductor layer, a first main electrode provided on the third semiconductor layer, a second main electrode provided on the third semiconductor layer, an insulating film provided on the second semiconductor layer, and a control electrode provided on the insulating film, wherein the band gap of the third semiconductor layer is greater than that of the second semiconductor layer and the control electrode is located between the first main electrode and the second main electrode.

FIG. 1 is a cross-sectional view showing the structure of an MIS field effect transistor using a nitride disclosed in Japanese Patent Laid-Open No. 2010-109086. This MIS field effect transistor 440 is equipped with an underlying layer 401 which is a first semiconductor layer, an electron transit layer 402 which is a second semiconductor layer, an electron supply layer 403 which is a third semiconductor layer, a source electrode 404 which is a first main electrode, a drain electrode 405 which is a second main electrode, a gate insulating film 406, and a gate electrode 407 which is a control electrode.

The underlying layer 401 is a layer of p-GaN which is a p-doped nitride semiconductor. The electron transit layer 402 is a layer of i-GaN which is an un-doped nitride semiconductor formed over the underlying layer 401. The electron supply layer 403 is a layer of i-AlGaN which is an undoped nitride semiconductor formed over the electron transit layer 402. The electron supply layer 403 has thereover the source electrode 404 and the drain electrode 405. The source electrode 404 and the drain electrode 405 have therebetween a region which is free of the electron supply layer 403 and in this region, the gate insulating film 406 is formed and the gate electrode 407 is formed over the gate insulating film 406. This MIS field effect transistor 440 is characterized by that due to a piezoelectric effect and depolarization, a two-dimensional electron gas is formed at a hetero interface between the electron supply layer 403 and the electron transit layer 402, which leads to a reduction in on resistance. Since the gate region does not have the electron supply layer 403, a two-dimensional electron gas due to a piezoelectric effect and depolarization is not formed, making it possible to realize normally-off characteristics.

[Patent Document 1] Japanese Patent Laid-Open No. 2010-109086

SUMMARY OF THE INVENTION

When the MIS field effect transistor 440 using a nitride semiconductor, as disclosed in Japanese Patent Laid-Open No. 2010-109086, is manufactured, the electron supply layer 403 must be formed in a region other than the gate region. There may be two methods for forming such an electron supply layer.

One of them is to form the electron supply layer 403 selectively, that is, only in a region other than the gate region. This method enables formation of the structure of the MIS field effect transistor 440 precisely, but requires twice epitaxial growth until the formation of the electron transit layer 402 and one and after the formation of the electron supply layer 403. As a result, it takes much time for manufacturing the device compared with a related-art MIS field effect transistor. As the step premised on mass production, twice growth is not desired from the standpoint of production efficiency. In addition, in the second growth step, a portion of the gate region not subjected to epitaxial growth must be protected with a mask material such as silicon oxide film. It is therefore difficult to achieve desired crystallinity or impurity concentration. Moreover, formation of defects or incorporation of impurities occurs at the re-growth interface and it deteriorates the mobility of a two dimensional electron gas at a hetero interface between the electron supply layer 403 and the electron transit layer 402, which may be a cause for increasing the on resistance. Further, this formation method causes problems, which may be a factor for making the operation of the semiconductor device unstable, typified by current collapse due to response of defect states or impurity states. As a result, they may deteriorate the yield of the products.

The other method is a method of forming all the semiconductor layers simultaneously and then carrying out recess etching. This method can achieve good crystallinity because layers including the electron supply layer 403 which is the uppermost layer can be formed successively by epitaxial growth. In this method, however, the depth direction of recess etching cannot be controlled well because of the lack of an effective recess stopper.

As a result, as shown in FIG. 2, there is a possibility of employing a structure in which a portion of the electron transit layer 402 formed below the electron supply layer 403 has been removed partially.

FIG. 2 is a cross-sectional view of an MIS field effect transistor 450 manufactured using a nitride semiconductor. In the MIS field effect transistor 450, the bottom surface of the recess is below the interface between the electron supply layer 403 and the electron transit layer 402 as a result of recess etching. Materials and constitution in the structure shown in FIG. 2 are similar to those in FIG. 1 and they are different only in the position of the bottom surface of the recess so that a description is omitted here. When the structure shown in FIG. 2 is employed, an electric current flows, with a two-dimensional electron gas as a carrier, through the hetero interface between the electron supply layer 403 and the electron transit layer 402 in a region other than the gate region subjected to recess etching. On the other hand, in the gate region, it flows through the bottom surface of the recess which is in the electron transit layer 402. In this structure, a position through which electrons flow is different in the depth direction between the gate region and the region other than the gate region. This leads to an increase in the resistance between the gate region and the region other than the gate region, resulting in an inevitable increase in the on resistance of the MIS field effect transistor 450 having this structure.

Means for solving the problems will next be described using the numbers or symbols to be used in the mode for carrying out the invention. These numbers or symbols are added in parentheses to clearly show the correspondence relationship between the description of Claims and the modes for carrying out the invention. However, these numbers or symbols should not be used for understanding of the technical scope of the invention described in Claims.

The nitride semiconductor device (100, 200, 300) according to the present invention is equipped with an underlying layer (13, 25, 37) which is a nitride semiconductor, a second electron transit layer (14, 26, 38) which is a nitride semiconductor and provided over the underlying layer (13, 25, 37), a first electron transit layer (15, 27, 39) which is a nitride semiconductor layer and provided over the second electron transit layer (14, 26, 38), an electron supply layer (16, 28, 29, 40) which is a nitride semiconductor and provided over the first electron transit layer (15, 27, 39), a gate region (101, 201, 301) provided in the electron supply layer (16, 28, 29, 40) and the first electron transit layer (15, 27, 39), a gate insulating film (18, 31, 42) provided over the gate region (101, 201, 301), and a gate electrode (19, 32) provided over the gate insulating film (18, 31, 42). The lattice constant of the second electron transit layer (14, 26, 38) is greater than that of the underlying layer (13, 25, 37).

The method of manufacturing the nitride semiconductor device (100, 200, 300) according to the invention is equipped with a step of providing an underlying layer (13, 25, 37), which is a nitride semiconductor, over a substrate (10, 22) of the nitride semiconductor device, a step of providing a second electron transit layer (14, 26, 38), which is a nitride semiconductor, over the underlying layer (13, 25, 37), a step of providing a first electron transit layer (15, 27, 39), which is a nitride semiconductor, over the second electron transit layer (14, 26, 38), a step of providing an electron supply layer (16, 28, 29, 40), which is a nitride semiconductor, over the first electron transit layer (15, 27, 39), and a step of etching to form a gate region (101, 201, 301) for controlling the nitride semiconductor device (100, 200, 300) by an applied voltage.

The present invention makes it possible to achieve crystallinity of a semiconductor film desired for the electrical properties of a field effect transistor which is a nitride semiconductor device, a simple step enabling mass production, and a reduction in the on resistance of the semiconductor device while maintaining normally-off characteristics.

DETAILED DESCRIPTION

Figure 1:
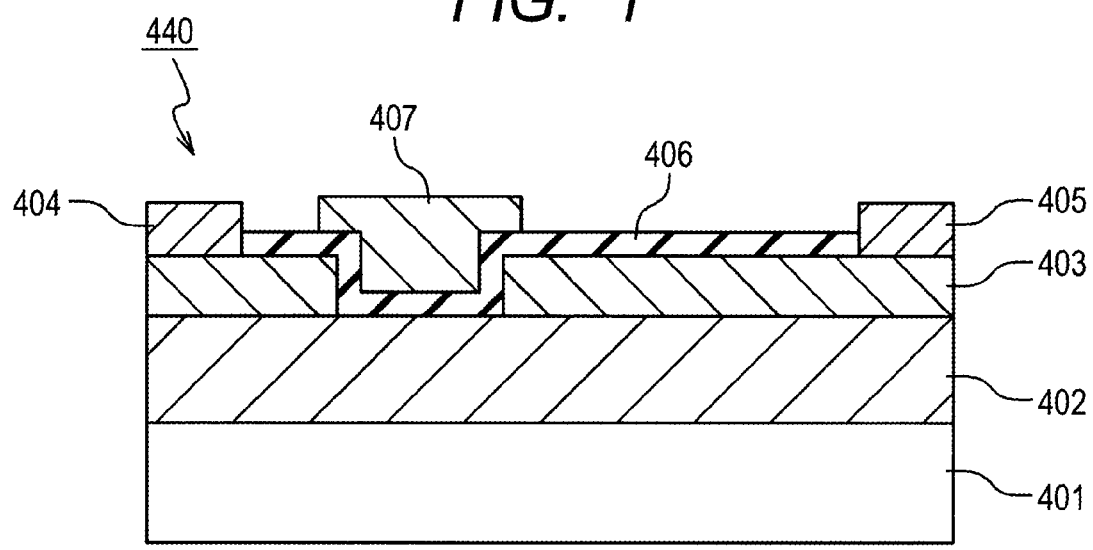
FIG. 1 is a schematic cross-sectional view of the MIS field effect transistor 440 using a nitride, disclosed by Japanese Patent Laid-Open No. 2010-109086.

The embodiments of the present invention will hereinafter be described based on drawings. It is to be noted that in the drawings for describing the embodiments, like members will be identified by like reference numerals and overlapping description will be omitted in principle.

[First Embodiment]

The constitution of the semiconductor device 100 using a nitride semiconductor according to the present embodiment will next be described referring to drawings.

Figure 3:
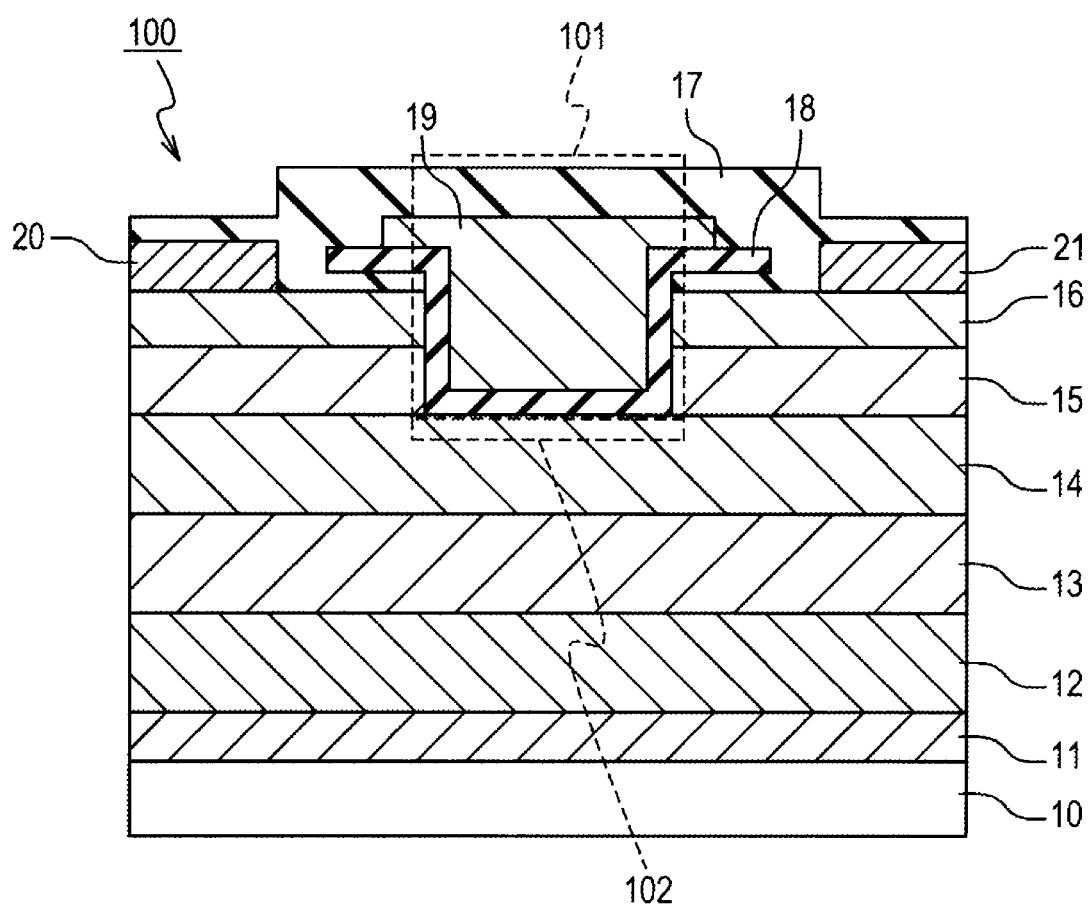
FIG. 3 is a cross-sectional view showing the structure of the nitride semiconductor device 100 according to the first embodiment of the present invention.

FIG. 3 is a cross-sectional view showing the structure of the semiconductor device 100 using a nitride semiconductor according to the present embodiment. The semiconductor device 100 in FIG. 3 is an MIS field effect transistor. As shown in FIG. 3, the semiconductor device 100 is equipped with a substrate 10, a nucleation layer 11, a buffer layer 12, an underlying layer 13, a second electron transit layer 14, a first electron transit layer 15, an electron supply layer 16, a semiconductor surface protecting film 17, a gate insulating film 18, a gate electrode 19, a source electrode 20, and a drain electrode 21.

In the present embodiment, silicon is used as the substrate 10. However, a substrate of another material such as GaN substrate, AlN substrate, sapphire substrate, or SiC substrate may be used, depending on the intended use.

In the present embodiment, AlN is used as the nucleation layer 11. However, another material, another composition ratio, or a desired film thickness may be selected, depending on the intended use or a substrate used. When GaN is used for the substrate, the formation of the nucleation layer may be omitted as needed.

In the present embodiment, an AlN/GaN superlattice is used as the buffer layer 12. Similar to the nucleation layer, however, another material, another composition ratio, or a desired film thickness may be selected, depending on the intended use or a substrate used, or formation of the buffer layer may be omitted.

In the present embodiment, $Al_{0.07}Ga_{0.93}N$ is used as the underlying layer 13. However, another material such as GaN, AlN, or InN, or a compound crystal thereof, another composition ratio, or a desired film thickness may be selected, depending on the intended use. Further, a desired impurity may be added depending on intended use. Examples of n type impurities include silicon, sulfur, and selenium and those of p type impurities include beryllium and magnesium.

In the present embodiment, the lattice constant in the in-plane direction of the underlying layer is taken over by a semiconductor layer formed over the underlying layer. This means that when a semiconductor layer having a lattice constant greater than that of the underlying layer is formed over the underlying layer, a compression strain has been applied to the semiconductor layer formed over the underlying layer. Examples of a material having a lattice constant greater than the underlying layer of the present embodiment include $In_xGa_{1-x}N$ ($0 \leq x \leq 1$) and materials such as AlGaN and InAlN having a smaller Al composition ratio than that of the underlying layer. When a semiconductor layer having a lattice constant smaller than that of the underlying layer over the underlying layer, on the other hand, a tensile strain occurs in the semiconductor layer formed over the underlying layer. Examples of the material having a lattice constant smaller than that of the underlying layer of the present embodiment include materials having an Al ratio higher than that of the underlying layer such as AlGaN and InAlN having a high Al composition ratio.

In the present embodiment, $In_{0.1}Ga_{0.9}N$ is used as the second electron transit layer 14. However, another material such as GaN, AlN, or InN, or a compound crystal thereof or a desired composition ratio may be selected depending on the intended use. Further, a desired impurity may also be added, depending on intended use. Examples of n type impurities include silicon, sulfur, and selenium, while those of p type impurities include beryllium and magnesium. Since electrons transit in the second electron transit layer 14, addition of a large amount of impurities may deteriorate the mobility due to Coulomb scattering. An addition amount of impurities to the second electron transit layer 14 is preferably not greater than $1 \times 10^{17}$ cm$^{-3}$.

The lattice constant of the second electron transit layer 14 is greater than that of the underlying layer 13. This means that a compression strain has been applied to the second electron transit layer 14. To prevent this compression strain from being relaxed, the thickness of the second electron transit layer 14 is preferably not greater than the critical film thickness at which transition increases.

The electron affinity of the second electron transit layer 14 is preferably greater than that of each of the underlying layer 13 and the first electron transit layer 15.

In addition, it is preferred that the second electron transit layer 14 is unreactive with an etchant used in etching of a semiconductor layer formed over the second electron transit layer 14 or the etching rate of it is sufficiently smaller than that of upper materials to be removed by etching.

The second electron transit layer 14 may be provided as a layer having a multilayer structure. When the second electron transit layer 14 has a multilayer structure, the electron affinity of the material of at least one of the layers is preferably greater than that of each of the underlying layer 13 and the first electron transit layer 15. It is more preferred that the lattice constant of the material of at least one of the layers is greater than that of the underlying layer 13.

In the present embodiment, GaN is used as the first electron transit layer 15. However, another material such as AlN or InN or a compound crystal thereof, or another composition ratio may be selected, depending on the intended use. Further, a desired impurity may be added, depending on the intended use. Examples of n type impurities include silicon, sulfur, and selenium, while those of p type impurities include beryllium and magnesium. Since electrons transit in the first electron transit layer 14, addition of a large amount of impurities may deteriorate the mobility due to Coulomb scattering. An addition amount of impurities to the first electron transit layer 15 is preferably not greater than $1 \times 10^{17}$ cm$^{-3}$.

The lattice constant of the first electron transit layer 15 in the present embodiment is preferably greater than that of the underlying layer 13. This means that a compression strain has been applied to the first electron transit layer 15. To prevent this compression strain from being relaxed, the thickness of the first electron transit layer 15 is preferably not greater than the critical film thickness at which transition increases.

In addition, the electron affinity of the first electron transit layer 15 is greater than that of each of the underlying layer 13 and the electron supply layer 16.

The first electron transit layer 15 may also be provided as a layer having a multilayer structure. When the electron transit layer 15 has a multilayer structure, the lattice constant of the material of at least one of the layers is preferably greater than that of the underlying layer 13. Furthermore, the electron affinity of the material of at least one of the layers is preferably greater than that of each of the underlying layer 13 and the electron supply layer 16.

In the present embodiment, $Al_{0.22}Ga_{0.78}N$ is used as the electron supply layer 16. However, another material such as AlN or InN or compound crystal thereof, or another composition ratio may be selected, depending on the intended use. It may also be provided as a multilayer structure such as a stack structure of materials different in Al composition ratio, for example, $Al_xGa_{1-x}N$ and $Al_yGa_{1-y}N$. Furthermore, a desired impurity may be added, depending on the intended use. Examples of n type impurities include silicon, sulfur, and selenium, while those of p type impurities include beryllium and magnesium.

In addition, the lattice constant of the electron supply layer 16 is preferably smaller than that of the underlying layer 13. This means that a tensile stain has been applied to the electron supply layer 16. To prevent this tensile strength from being relaxed, the film thickness of the electron supply layer 16 is preferably not greater than the critical film thickness at which transition increases.

The electron affinity of the electron supply layer 16 is preferably smaller than that of each of the second electron transit layer 14 and the first electron transit layer 15.

The electron supply layer 16 may also be provided as a layer having a multilayer structure. When the electron supply layer 16 has a multilayer structure, the electron affinity of the material of at least one of the layers is preferably smaller than that of each of the second electron transit layer 14 and the first electron transit layer 15. Furthermore, the lattice constant of the material of at least one of the layers is preferably smaller than that of the underlying layer 13.

In the present embodiment, SiN is used as the semiconductor protecting film 17. However, another material, another composition ratio, or a desired film thickness may be selected, depending on the intended use or a substrate used. It may also have a multilayer structure obtained by stacking two or more materials different from each other, depending on the intended use. A semiconductor surface protecting film to be brought into contact with a semiconductor is commonly required to have a forbidden band width greater than that of the semiconductor to be brought into contact with the semiconductor surface protecting film and have an electron affinity smaller than that of the semiconductor to be brought into contact with the semiconductor surface protecting film. As well as SiN, many insulating materials such as $SiO_2$, SiON, SiOC, $Al_2O_3$, $HfO_2$, $ZrO_2$, and organic films can be given as candidates for this protecting film. For the semiconductor surface protecting film in an active region, however, a material capable of decreasing the density of an interface state formed at the interface with the semiconductor to be brought into contact the semiconductor surface protecting film is desired in order to suppress current collapse.

In the present embodiment, $Al_2O_3$ is used as the gate insulating film 18. However, another material or composition ratio, or a desired film thickness may be selected, depending on the intended use or a substrate used. It may also have a multilayer structure obtained by stacking two or more materials different from each other, depending on the intended use. The gate insulating film 18 is commonly required to have a forbidden band width greater than that of a semiconductor to be brought into contact with the gate insulating film 18 and have an electron affinity smaller than that of the semiconductor to be brought into contact with the gate insulating film 18. As well as $Al_2O_3$, many insulating materials such as $SiO_2$, SiON, SiN, $HfO_2$, and $ZrO_2$ can be given as candidates for this insulating film. Since the material of this film has an influence on the voltage which can be applied to a gate electrode and a threshold voltage, the film must be designed in consideration of the breakdown voltage, permittivity, and film thickness of the insulating material. In particular, when an electric field is formed in the insulating film as in the present embodiment, the threshold voltage is proportional to the gate insulating film thickness so that deliberate consideration is necessary for designing them.

In the present embodiment, TiN is used as the gate electrode 19. However, another material, another composition ratio, or a desired film thickness may be selected, depending on the intended use or a substrate used. Further, it may also have a multilayer structure obtained by stacking two or more materials different from each other, depending on the intended use. The material of the gate electrode is however preferably unreactive or sparingly reactive with the semiconductor protecting film 17 or the gate insulating film 18 to be brought in contact with the gate electrode 19. As well as TiN, boron- or phosphorus-doped polycrystalline silicon; titanium, aluminum, and nickel, and silicon compounds or nitrogen compounds thereof may be given as candidates for the materials of the gate electrode.

In the present embodiment, aluminum is used as the source electrode 20 and the drain electrode 21. The source electrode 20 and the drain electrode 21 preferably form an ohmic contact with the semiconductor layer to be brought into contact with the source electrode 20 and the drain electrode 21. Particularly when, n type impurities have been added to the semiconductor layer to be brought into contact with the source electrode 20 and the drain electrode 21 by ion implantation or the like during crystal growth or after crystal growth, many electrode materials form an ohmic contact. In this case, therefore, the material can be selected from a wider range. The source electrode material and the drain electrode material are however preferably unreactive or sparingly reactive with films such as semiconductor protecting film to be brought into contact with the source electrode 20 and the drain electrode 21. As well as aluminum, titanium, molybdenum, niobium, and vanadium, and mixtures, stacks, silicon compounds, and nitrogen compounds thereof can be given as candidates for the material of the source electrode 20 and the drain electrode 21.

A description will next be made on the manufacturing method of the semiconductor device 100.

A nucleation layer 11, a buffer layer 12, an underlying layer 13, a second electron transit layer 14, a first electron transit layer 15, and an electron supply layer 16 are formed successively over a substrate 10. In the present embodiment, metal organic chemical vapor deposition (MOCVD) is used for stacking of layers from the nucleation layer 11 to the electron supply layer 16. However, molecular beam epitaxy (MBE) may be employed for the formation as needed.

Then, a semiconductor surface protecting film 17 is formed over the electron supply layer 16. In the present embodiment, the semiconductor surface protecting film 17 is formed by plasma CVD (PECVD: Plasma-Enhanced Chemical Vapor Deposition), but this method can be changed to another method as needed.

Then, in the stack structure thus obtained, a region from which the semiconductor surface protecting film 17, the electron supply layer 16, and the first electron transit layer 15 have been removed is formed. This region is formed by recess etching. For this recess etching, dry etching is employed in the present embodiment, but wet etching may be employed as needed. This partially removed region is designated as a gate region 101. A region of a layer deposited below the bottom surface (on the side of the substrate 10) of the gate region 101, through which electrons flow when the semiconductor device 100 using a nitride semiconductor is ON is designated as a channel region 102. The horizontal-direction length of the channel region 102 is made equal to the horizontal-direction length of the gate region. Since the first electron transit layer 15 has been etched completely, the position of the bottom surface of the recess in the depth direction is the interface between the first electron transit layer 15 and the second electron transit layer 14.

Using this recess etching step makes it possible to form a structure having a nitride semiconductor at two positions, that is, below the source portion and below the drain portion, with the gate region 101 therebetween. This can omit the necessity of partial epitaxial growth below the source portion and below the drain portion. As a result, this step simplifies the manufacturing process and further, enables formation of a thin film having good crystallinity and low impurity concentration. In addition, a reaction rate of the second electron transit layer 14 with an etchant is sufficiently small compared with that of the first electron transit layer 15 provided thereon. The second electron transit layer 14 therefore functions as a recess stopper and enables overcoming of the problem of the related-art technology.

Next, a gate insulating film 18 is formed in the gate region 101. In the present embodiment, the gate insulating film 18 is formed using atomic layer deposition (ALD). It can however be formed using a variety of processes such as normal-pressure CVD, layer-by-layer deposition (LLD), MOCVD, MBE, plasma CVD, catalytic CVD, and thermal oxidation as needed.

Next, a gate electrode 19 is formed on the gate insulating film 18. In the present embodiment, the gate electrode 19 is formed using sputtering, but it can also be formed by CVD, vacuum deposition, or the like as needed.

Next, at positions on the sides opposite to each other with the gate region therebetween, a source electrode 20 and a drain electrode 21 are formed on the electron supply layer 16, respectively. In the present embodiment, the source electrode 20 and the drain electrode 21 are formed using vacuum deposition, but they may be formed using sputtering or the like as needed. Then, a semiconductor surface protecting film 17 is formed again.

Next, a description will be made on the operation of the semiconductor device 100.

In the vicinity of the interface between the second electron transit layer 14 and the first electron transit layer 15, there exist a difference in band gap, electron affinity, and lattice constant between their materials so that a two-dimensional electron gas is generated due to a piezoelectric effect and spontaneous polarization effect. For the same reason, a two-dimensional electron gas is generated also in the vicinity of the interface between the first electron transit layer 15 and the electron supply layer 16.

On the other hand, the electron supply layer 16 has been removed completely from the gate region 101 so that a two-dimensional electron gas is not generated in the channel region 102 below the gate insulating film 18. No free carriers are therefore present in the channel region 102 effectively insofar as a voltage is applied to the gate electrode 19 to induce free carriers. As a result, normally-off characteristics can be achieved in the semiconductor device 100.

In regions other than the gate region 101, as described above, a two-dimensional electron gas is generated in the vicinity of the interface between the second electron transit layer 14 and the first electron transit layer 15 and the interface between the first electron transit layer 15 and the electron supply layer 16. Furthermore, a quantum state common to the second electron transit layer 14 and the first electron transit layer 15 is formed so that no resistance is applied to transfer of electrons from the first electron transit layer 15 to the second electron transit layer 14.

When a voltage (which will hereinafter be called "threshold voltage") enough for inducing electrons is applied to the gate electrode 19, carrier conduction below the gate region 101 occurs in the channel region 102 in the vicinity of the interface between the gate insulating film 18 and the second electron transit layer 14. A difference in the position of electron conduction in the depth direction (direction toward the substrate 10) between the gate region 101 and a region other than the gate region 101 leads to an increase in the on resistance as described above. It is desired that in the depth direction, the depth of electron conduction in the region other than the gate region 101 approaches the depth of electron conduction in the channel region 102 in order to achieve a reduction in on resistance.

In the invention, as described above, the lattice constant in the in-plane direction of the underlying layer is taken over by the semiconductor layer formed over the underlying layer, meaning that when a semiconductor layer having a lattice constant greater than that of the underlying layer is formed over the underlying layer, a compression strain is applied to the semiconductor layer formed over the underlying layer. When a semiconductor layer having a smaller lattice constant than that of the underlying layer is formed over the underlying layer, a tensile strain occurs in the semiconductor layer formed over the underlying layer.

A compression strain is applied to the second electron transit layer 14 so that due to a piezoelectric effect, a negative charge is induced in the second electron transit layer 14 on the side of the substrate 10 and a positive charge is induced in the second electron transit layer on the side of the first electron transit layer 15. As a result, an inclination in a conduction band, in other words, an electric field occurs so as to make smaller the electron affinity in the second electron transit layer 14 on the side of the substrate 10 and make greater the electron affinity on the side of the first electron transit layer 15. Also in the gate insulating film 18, although due to a difference in permittivity from the second electron transit layer 14, an inclination angle (electric field intensity) is different, an inclination is almost maintained so that it is effective for increasing the threshold voltage, in other words, the on voltage of the semiconductor device 100 on the positive side.

In the present embodiment, only the principal portion of the field effect transistor is described. In practice, the semiconductor device is completed after conducting a protecting film formation step and a wiring step, following the manufacturing steps described in the present embodiment. These protecting film formation and wiring steps to be conducted also in the invention may have a desired structure or desired constitution, depending on the object or intended use.

It has been found from the above description that since the second electron transit layer 14 is provided properly below the electron transit layer 15, the second electron transit layer 14 serves as a recess stopper and facilitates formation of the gate region 101 and control of etching depth in recess etching. In the present embodiment, normally-off characteristics are secured as in the related-art technology.

[Second Embodiment]

Referring to drawings, a description will next be made on the constitution of a semiconductor device 200 using a nitride semiconductor according to the present embodiment.

Figure 4:
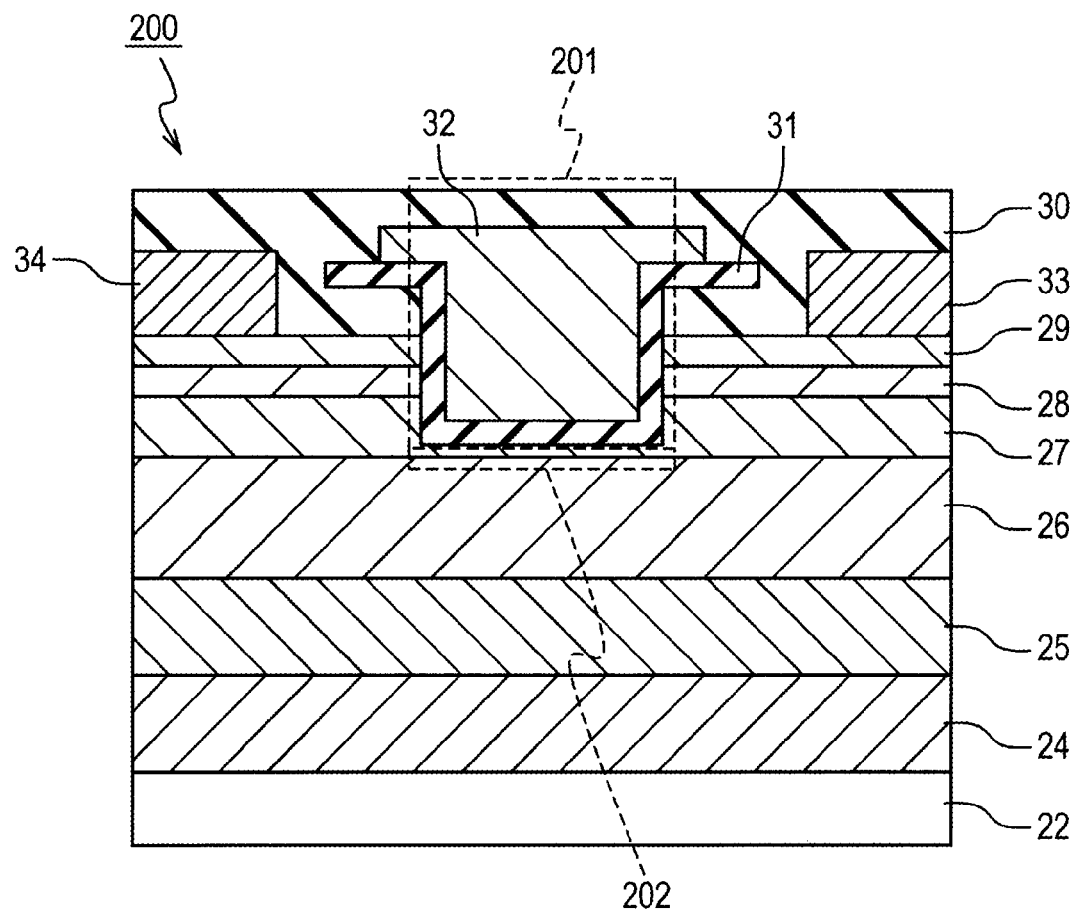
FIG. 4 is a cross-sectional view showing the structure of the nitride semiconductor device 200 according to the second embodiment of the present invention.

Referring to FIG. 4, the semiconductor device 200 is equipped with a substrate 22, a buffer layer 24, an underlying layer 25, a second electron transit layer 26, a first electron transit layer 27, a second electron supply layer 28, a first electron supply layer 29, a semiconductor surface protecting film 30, a gate insulating film 31, a gate electrode 32, a source electrode 33, and a drain electrode 34.

In the present embodiment, SiC is used as the substrate 22. However, another material may be used, depending on the intended use.

In the present embodiment, $Al_{0.2}Ga_{0.8}N$ is used as the buffer layer 24. However, another material, another composition ratio, or a desired film thickness can be selected, depending on the intended use or a substrate used. It is also possible to omit the formation of the buffer layer.

In the present embodiment, $Al_{0.05}Ga_{0.95}N$ is used as the underlying layer 25. However, another material such as GaN, AlN, or InN, or a compound crystal thereof, another composition ratio, or a desired film thickness may be selected, depending on the intended use. Furthermore, a desired impurity may be added, depending on the intended use.

In the present invention, as described above, the lattice constant in the in-plane direction of the underlying layer is taken over by a semiconductor layer formed over the underlying layer. This means that when the underlying layer has thereover a semiconductor layer having a lattice constant greater than that of the underlying layer, a compression strain is applied to the semiconductor layer formed over the underlying layer. When the underlying layer has thereover a semiconductor layer having a lattice constant smaller than that of the underlying layer, a tensile strain is applied to the semiconductor layer formed over the underlying layer.

In the present embodiment, $In_{0.08}Ga_{0.92}N$ is used as the second electron transit layer 26. However, another material such as GaN, AlN, or InN, or a compound crystal thereof or a desired composition ratio may be selected, depending on the intended use. Furthermore, a desired impurity may be added, depending on the intended use. Since electrons transit in the second electron transit layer 26, addition of a large amount of impurities may deteriorate the mobility due to Coulomb scattering. An addition amount of impurities to the second electron transit layer 26 is preferably not greater than $1 \times 10^{17}$ cm$^{-3}$.

The lattice constant of the second electron transit layer 26 is greater than that of the underlying layer 25. This means that a compression strain is applied to the second electron transit layer 26. To prevent this compression strain from being relaxed, the thickness of the second electron transit layer 26 is preferably not greater than the critical film thickness at which transition increases.

The electron affinity of the second electron transit layer 26 is preferably greater than that of each of the underlying layer 25 and the first electron transit layer 27.

The second electron transit layer 26 may also have a multilayer structure. When the second electron transit layer 27 is provided as a multilayer structure, the electron affinity of the material of at least one of the layers is preferably greater than the electron affinity of each of the underlying layer 25 and the first electron transit layer 27. Moreover, the lattice constant of the material of at least one of the layers is preferably greater than the lattice constant of the underlying layer 25.

In the present embodiment, GaN is used as the first electron transit layer 27. However, another material such as AlN or InN, or a compound crystal thereof or another composition ratio may be selected, depending on the intended use. Furthermore, a desired impurity may be added, depending on the intended use. Since electrons transit in the first electron transit layer 27, addition of a large amount of impurities may deteriorate the mobility due to Coulomb scattering. An addition amount of impurities to the first electron transit layer 27 is preferably not greater than $1 \times 10^{17}$ cm$^{-3}$.

In the present embodiment, the lattice constant of the first electron transit layer 27 is preferably greater than that of the underlying layer 25. This means that a compression strain is applied to the first electron transit layer 27. To prevent this compression strain from being relaxed, the thickness of the first electron transit layer 27 is preferably not greater than the critical film thickness at which transition increases.

The electron affinity of the first electron transit layer 27 is preferably greater than that of each of the underlying layer 25 and the second electron supply layer 28.

The first electron transit layer 27 may also have a multilayer structure. When the first electron transit layer 27 has a multilayer structure, the lattice constant of the material of at least one of the layers is preferably greater than that of the underlying layer 25. Moreover, the electron affinity of the material of at least one of the layers is preferably greater than that of each of the underlying layer 25 and the second electron supply layer 28.

In the present embodiment, $Al_{0.2}Ga_{0.8}N$ is used as the second electron supply layer 28. However, another material such as AlN or InN, or a compound crystal thereof, or another composition ratio may be selected, depending on the intended use. Furthermore, a desired impurity may be added, depending on the intended use.

The lattice constant of the second electron supply layer 28 is preferably smaller than that of the underlying layer 25. This means that a tensile strain is applied to the second electron supply layer 28. To prevent this tensile strain from being relaxed, the film thickness of the second electron supply layer 28 is preferably not greater than the critical film thickness at which transition increases.

The electron affinity of the second electron supply layer 28 is preferably smaller than that of each of the second electron transit layer 26 and the first electron transit layer 27.

In the present embodiment, $Al_{0.25}Ga_{0.75}N$ is used as the first electron supply layer 29. However, another material such as AlN or InN, or a compound crystal thereof, or another composition ratio may be selected, depending on the intended use. Furthermore, a desired impurity may be added, depending on the intended use.

The lattice constant of the first electron supply layer 29 is preferably smaller than that of each of the underlying layer 25 and the second electron supply layer 28. This means that a tensile strain is applied to the first electron supply layer 29. To prevent this tensile strain from being relaxed, the thickness of the first electron supply layer 29 is preferably not greater than the critical film thickness at which transition increases.

The electron affinity of the first electron supply layer 29 is preferably smaller than that of each of the second electron transit layer 26 and the first electron transit layer 27.

In the present embodiment, SiON is used as the semiconductor protecting film 30. However, another material, another composition ratio, or a desired film thickness may be selected, depending on the intended use or a substrate used. The semiconductor protecting film may have a multilayer structure obtained by stacking two or more materials different from each other, depending on the intended use. A semiconductor surface protecting film to be brought into contact with a semiconductor is commonly required to have a forbidden band width greater than that of the semiconductor to be brought into contact with the semiconductor surface protecting film and have an electron affinity smaller than that of the semiconductor to be brought into contact with the semiconductor surface protecting film. For the semiconductor surface protecting film in an active region, however, a material capable of decreasing the density of an interface state formed at the interface with the semiconductor to be brought into contact the semiconductor surface protecting film is desired in order to suppress current collapse.

In the present embodiment, $ZrO_2$ is used as the gate insulating film 31. However, another material or composition ratio, or a desired film thickness may be selected, depending on the intended use or a substrate used. The gate insulating film may have a multilayer structure obtained by stacking two or more materials different from each other, depending on the intended use. The gate insulating film 31 is commonly required to have a forbidden band width greater than that of a semiconductor to be brought into contact with the gate insulating film 31 and have an electron affinity smaller than that of the semiconductor to be brought into contact with the gate insulating film 31. Since the material of this film has an influence on the voltage which can be applied to a gate electrode or a threshold voltage, this film should be designed in consideration of the dielectric breakdown, permittivity, or film thickness of the insulating material. In particular, when an electric field is formed in the insulating film as in the present embodiment, the threshold voltage is proportional to the thickness of the gate insulating film so that deliberate consideration is necessary for designing.

In the present embodiment, p type polycrystalline silicon is used as the gate electrode 32. However, another material, another composition ratio, or a desired film thickness may be selected, depending on the intended use or a substrate used. It may also have a multilayer structure obtained by stacking two or more materials different from each other, depending on the intended use. The material of the gate electrode is however preferably unreactive or sparingly reactive with the semiconductor protecting film 30 or the gate insulating film 31 to be brought into contact with the gate electrode 32.

In the present embodiment, $Al_3Ti$ is used as the source electrode 33 and the drain electrode 34. The source electrode 33 and the drain electrode 34 may each form an ohmic contact with a semiconductor layer to be brought into contact with the source electrode 33 or the drain electrode 34. In particular, when an n type impurity is added to the semiconductor layer to be brought into contact with the source electrode 33 and the drain electrode 34 by ion implantation during crystal growth or after crystal growth, many electrode materials form an ohmic contact. In this case, therefore, the material can be selected from a wide range. It is however desired that the material of the source electrode and the drain electrode is unreactive or sparingly reactive with the semiconductor protecting film or the like to be brought into contact with the source electrode 33 and the drain electrode 34.

In the present embodiment, SiC is used as the substrate. In this case, a nucleation layer provided in the first embodiment is not formed because desirable crystal growth can be achieved without such a nucleation layer.

A description will next be made on the manufacturing method of the semiconductor device 200. A buffer layer 24, an underlying layer 25, a second electron transit layer 26, a first electron transit layer 27, a second electron supply layer 28, and a first electron supply layer 29 are formed successively over a substrate 22. In the present embodiment, metal organic chemical vapor deposition (MOCVD) is used for stacking of from the buffer layer 24 to the first electron supply layer 29. Molecular beam epitaxy (MBE) may also be employed for the formation as needed.

Then, a semiconductor surface protecting film 30 is formed over the first electron supply layer 29. In the present embodiment, the semiconductor surface protecting film 30 is formed by plasma CVD (PECVD: Plasma-Enhanced Chemical Vapor Deposition), but this can be changed to another method as needed.

Then, in the stack structure thus obtained, a region from which the semiconductor surface protecting film 30, the first electron supply layer 29, the second electron supply layer 28, and the first electron transit layer 27 have been partially removed is formed. This region is formed by recess etching. For this recess etching, dry etching is employed in the present embodiment, but wet etching may be employed as needed. This partially removed region is designated as a gate region 201. A region of a layer deposited below the bottom surface (on the side of the substrate 10) of the gate region 101, through which layer electrons flow when the semiconductor device 200 using a nitride semiconductor is ON is designated as a channel region 202. The horizontal-direction length of the channel region 202 is made equal to the horizontal-direction length of the gate region. Since the first electron transit layer 27 has been etched partially, the position of the bottom surface of the recess in the depth direction is in the first electron transit layer 27.

An advantage of using this recess etching step is similar to that in the first embodiment so that a description on it is omitted here.

Next, a gate insulating film 31 is formed in the gate region 201. In the present embodiment, the gate insulating film 31 is formed using atomic layer deposition (ALD). It can however be formed using a variety of processes such as normal-pressure CVD, layer-by-layer deposition (LLD), MOCVD, MBE, plasma CVD, catalytic CVD, and thermal oxidation, as needed.

Next, a gate electrode 32 is formed on the gate insulating film 31, successively. In the present embodiment, the gate electrode 32 is formed by implanting boron ions after film formation by CVD and then carrying out activation annealing. Instead of this process, another process may be employed for the formation as needed.

Next, at positions on the sides opposite to each other with the gate region therebetween, a source electrode 33 and a drain electrode 34 are formed on the first electron supply layer 29, respectively. In the present embodiment, the source electrode 33 and the drain electrode 34 are formed by conducting vacuum deposition with an electron gun and then alloying by the heat treatment thereafter. Instead of it, they may be formed by sputtering or CVD as needed. Then, a semiconductor surface protecting film 30 is formed again.

Next, a description will be made on the operation of the semiconductor device 200. As described above, in order to achieve a reduction in the on resistance, the depth of electron conduction in a region other than the gate region 201 desirably approaches the depth of electron conduction in the channel region 202 in the depth direction.

Figure 5A:
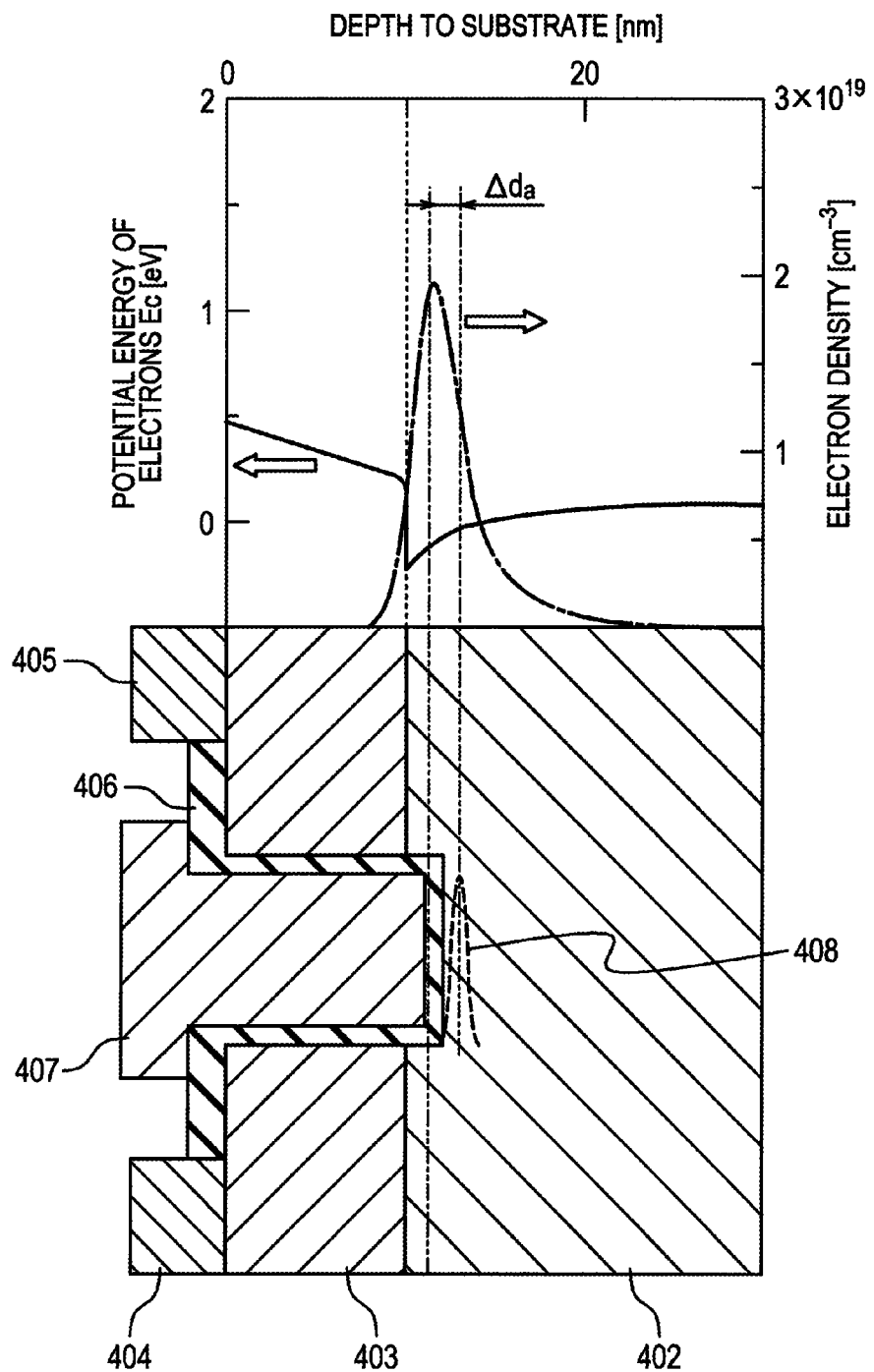
FIG. 5A shows, when the electron transit layer 402 is a single layer and at the same time, the bottom surface of the recess lies in the electron transit layer 402 as in the related-art technology, a band diagram showing the bottom Ec of a conduction band and a graph showing the electron density of a two-dimensional electron gas.
Figure 5B:
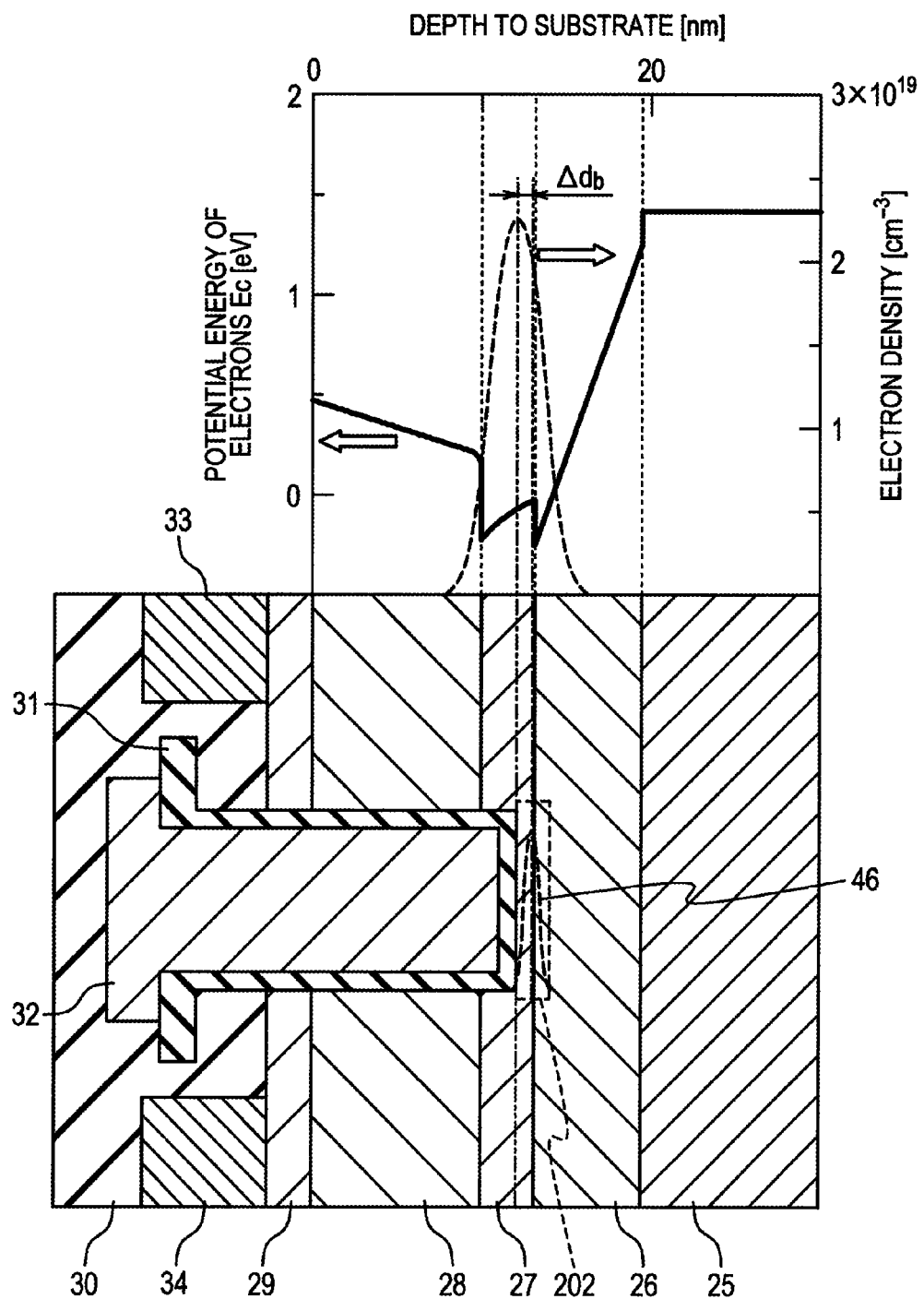
FIG. 5B shows, when the electron transit layer is made of two layers and at the same time, the bottom surface of a recess lies in the first electron transit layer, a band diagram showing the bottom Ec of a conduction band and a graph showing the electron density of a two-dimensional electron gas.
Figure 5C:
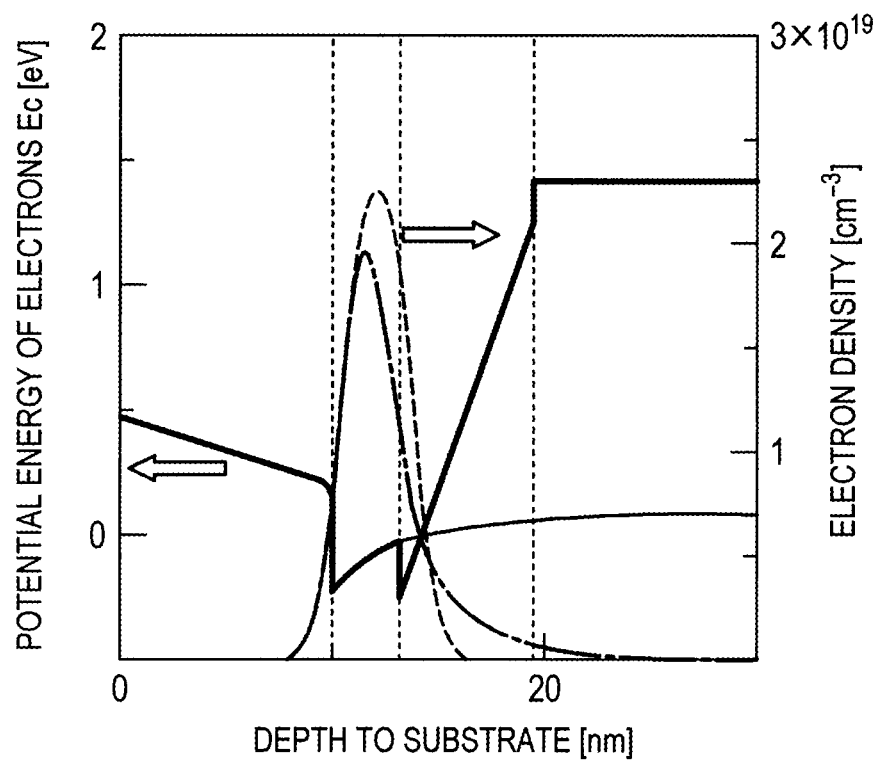
FIG. 5C collectively shows the band diagrams showing the bottom of the conduction band in FIGS. 5A and 5B and graphs showing the electron density of a two-dimensional electron gas.

FIGS. 5A, 5B, and 5C each include a band diagram showing the bottom $E_c$ of a conduction bond relative to the depth direction from the electron supply layer and a graph showing an electron density. The term "depth direction" as used herein means the direction to a substrate. The potential energy $E_c$ of electrons is plotted on the left ordinate and the electron density is plotted on the right ordinate. The potential energy $E_c$ of the band diagram is based on the Fermi level of the electron supply layer.

Figure 2:
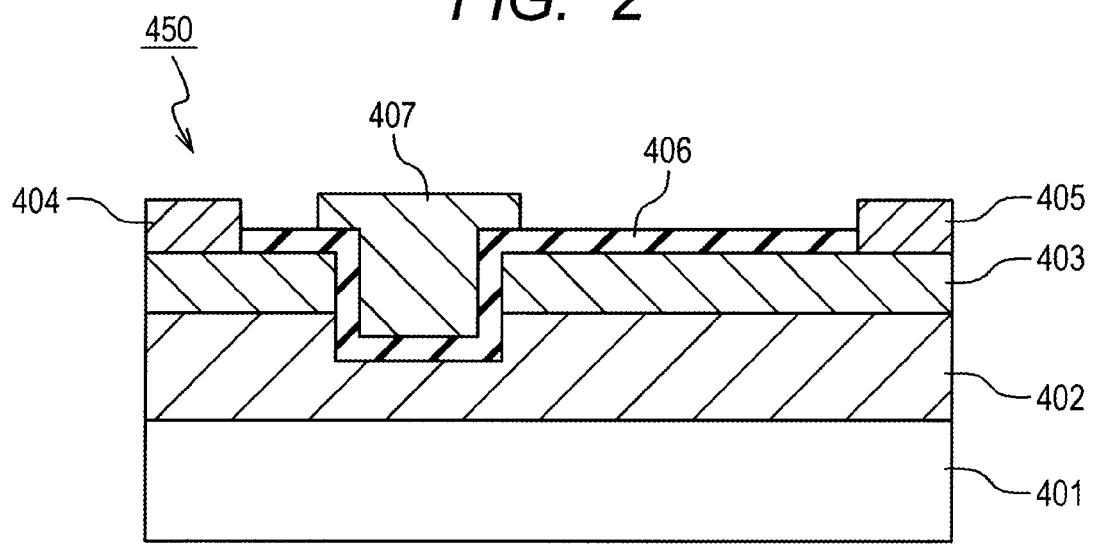
FIG. 2 is a cross-sectional view of an MIS field effect transistor 450 using a nitride semiconductor, according to the related-art technology when the bottom surface of a recess is below the interface between an electron supply layer 403 and an electron transit layer 402.

FIG. 5A includes a band diagram showing the bottom $E_c$ of a conduction band and a graph showing the electron density of a two-dimensional electron gas when the electron transit layer 402 is a single layer and at the same time, the bottom surface of the recess is present in the electron transit layer 402, which is the related-art technology. Below this graph, a portion of the cross-sectional view of the semiconductor device of FIG. 2 is shown, after turned on its side to correspond the depth direction of the graph to the depth direction of the cross-sectional view. In the graph, $\Delta d_a$ shows a difference in depth direction between the peak 8 of the electron density in the channel region and the peak of the electron density of a two-dimensional electron gas in a region other than the gate region.

FIG. 5B includes a band diagram showing the bottom $E_c$ of a conduction band and a graph showing the electron density of a two-dimensional electron gas when the electron transit layer includes two layers and at the same time, the bottom surface of the recess lies in the first electron transit layer. Below this graph, a portion of the cross-sectional view (FIG. 4) of the semiconductor device of the present embodiment is shown, after turned on its side to correspond the depth direction of the graph to the depth direction of the cross-sectional view. In the graph, $\Delta d_b$ shows a difference in depth direction between the peak 46 of the electron density in the channel region 202 and the peak of the electron density of a two-dimensional electron gas in a region other than the gate region 201.

FIG. 5C includes, in an overlapped manner, the band diagram showing the bottom of the conduction band and the graph showing the electron density of a two-dimensional electron gas, both shown in FIGS. 5A and 5B.

It has been confirmed from FIG. 5C that the electron density of a two-dimensional electron gas is shifted on the side of the substrate in the embodiment of the invention. It is apparent from FIGS. 5A and 5B that $\Delta d_b$ is smaller than $\Delta d_a$. This suggests that according to the embodiment of the invention, the distance of electron distribution in the depth direction between the channel region and the region other than the gate region can be decreased, resulting in a decrease in the on resistance of the semiconductor device 200.

Furthermore, according to the present embodiment, electrons travelling in the channel region 202 are accumulated at the interface between the gate insulating film 31 and the first electron transit layer 27 and in the second electron transit layer 26. Electrons travelling at the interface between the gate insulating film 31 and the first electron transit layer 27 move away from the interface between the gate insulating film 31 and the first electron transit layer 27 on average so that deterioration in mobility due to the interface level present at the interface between the gate insulating film 31 and the first electron transit layer 27 can be suppressed.

As in the present embodiment, dry etching with a chlorine-containing gas is usually employed for partial removal of the first electron transit layer 27, however, control of the depth of etching should be conducted only by etching time and adequate control and high accuracy are required.

It has therefore been found that when the bottom surface of the recess is located in the first electron transit layer 27, a multi-layer structure employed for the electron transit layer makes it possible to approximate, in the depth direction, the electron density distribution of the channel portion to the electron density distribution by a two-dimensional electron gas, compared with the related-art technology. As a result, the on resistance of the semiconductor device 200 using a nitride semiconductor can be reduced. In addition, the average of the electron density distribution in the channel region 202 can be shifted from the gate insulating film to the substrate side. This results in suppression of deterioration of mobility due to an interface level present at the interface with the gate insulating film 31. In the present embodiment, the normally-off characteristics can be kept as in the related-art technology.

[Third Embodiment]

The constitution of a semiconductor device 300 using a nitride semiconductor according to the present embodiment will next be described referring to drawings.

Figure 6:
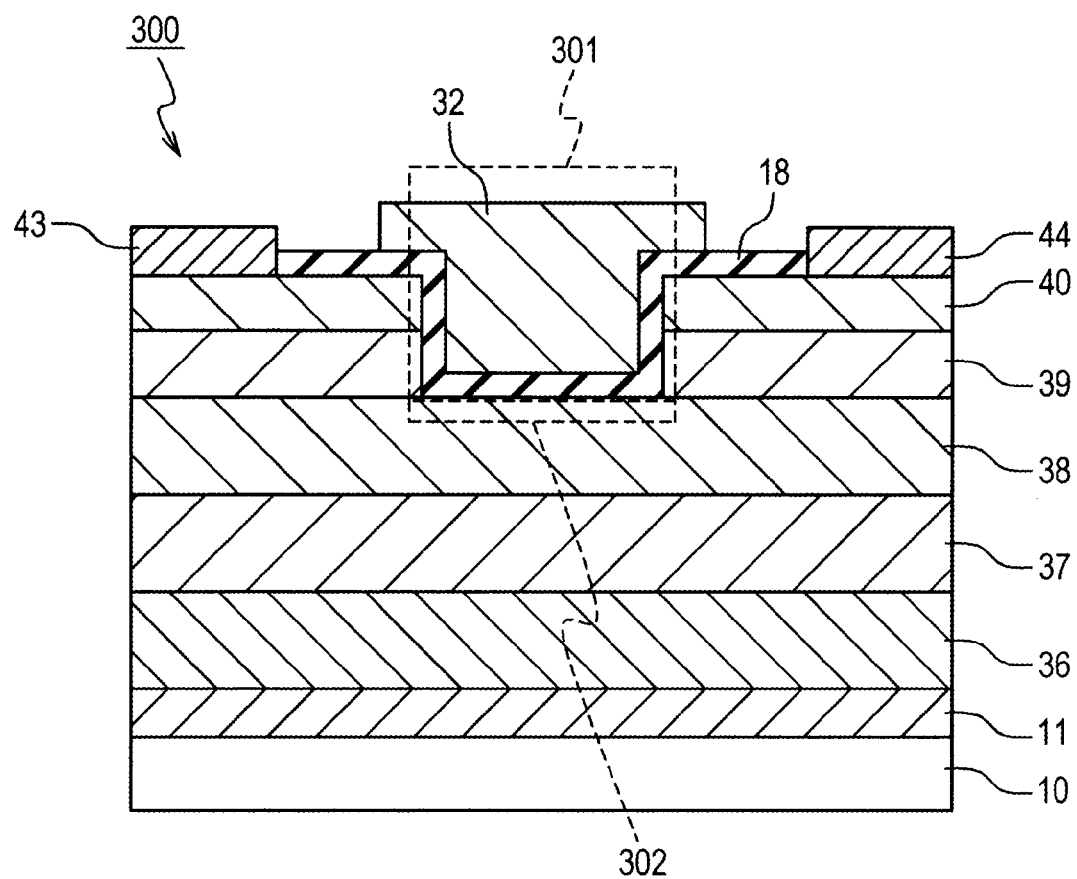
FIG. 6 is a cross-sectional view showing the structure of the nitride semiconductor device 300 according to the third embodiment of the present invention.

FIG. 6 is a cross-sectional view illustrating the structure of the semiconductor device 300 using a nitride semiconductor according to the present embodiment. The semiconductor device 300 in FIG. 6 is an MIS field effect transistor. According to FIG. 6, the semiconductor device 300 is equipped with a substrate 10, a nucleation layer 11, a buffer layer 36, an underlying layer 37, a second electron transit layer 38, a first electron transit layer 39, an electron supply layer 40, a gate insulating film 18, a gate electrode 32, a source electrode 43, and a drain electrode 44.

In the present embodiment, $Al_{0.3}Ga_{0.7}N$ is used as the buffer layer 36. However, depending on the intended use or a substrate used, another material, another composition ratio, or a desired film thickness may be selected or formation of the buffer layer may be omitted.

In the present embodiment, $Al_{0.13}Ga_{0.87}N$ is used as the underlying layer 37. However, another material such a GaN, AlN, or InN, or a compound crystal thereof, another composition ratio, or a desired film thickness may be selected, depending on the intended use. Furthermore, a desired impurity may be added, depending on the intended use.

As described above, the lattice constant of the underlying layer in the in-plane direction is taken over by a semiconductor layer formed over the underlying layer. This means that when a semiconductor layer having a lattice constant greater than that of the underlying layer is formed over the underlying layer, a compression strain is applied to the semiconductor layer formed over the underlying layer. On the other hand, when a semiconductor layer having a lattice constant smaller than that of the underlying layer is formed over the underlying layer, a tensile strain is applied to the semiconductor layer formed over the underlying layer.

In the present embodiment, $In_{0.05}Ga_{0.95}N$ is used as the second electron transit layer 38. However, another material such as GaN, AlN, or InN, or a compound crystal thereof or a desired composition ratio may be selected, depending on the intended use. Furthermore, a desired impurity may be added, depending on the intended use. Since electrons travel in the second electron transit layer 38, addition of a large amount of impurities may deteriorate the mobility due to Coulomb scattering. An addition amount of impurities to the second electron transit layer 38 is preferably not greater than $1\times10^{17}$ cm$^{-3}$.

The lattice constant of the second electron transit layer 38 is greater than that of the underlying layer 37. This means that a compression strain is applied to the second electron transit layer 38. To prevent this compression strain from being relaxed, the thickness of the second electron transit layer 38 is preferably not greater than the critical film thickness at which transition increases.

The electron affinity of the second electron transit layer 38 is preferably greater than that of each of the underlying layer 37 and the first electron transit layer 39.

The second electron transit layer 38 may also be provided as a multilayer structure. When the second electron transit layer 38 has a multilayer structure, the electron affinity of the material of at least one of the layers is preferably greater than the electron affinity of each of the underlying layer 37 and the first electron transit layer 39. Moreover, the lattice constant of the material of at least one of the layers is preferably greater than that of the underlying layer 37.

In the present embodiment, GaN is used as the first electron transit layer 39. However, another material such as AlN or InN, or a compound crystal thereof or another composition ratio may be selected, depending on the intended use. Furthermore, a desired impurity may be added, depending on the intended use. Since electrons travel in the first electron transit layer 39, addition of a large amount of impurities may deteriorate the mobility due to Coulomb scattering. An addition amount of impurities to the first electron transit layer 39 is therefore preferably not greater than $1\times10^{17}$ cm$^{-3}$.

In the present embodiment, the lattice constant of the first electron transit layer 39 is preferably equal or approximate enough not to cause a strain, to that of the underlying layer 37. This means that since no strain is applied to the first electron transit layer 39, it is not necessary to consider the critical film thickness at which transition increases.

The electron affinity of the first electron transit layer 39 is preferably greater than that of each of the underlying layer 37 and the electron supply layer 40.

In the present embodiment, $In_{0.13}Al_{0.87}N$ is used as the electron supply layer 40. However, another material such as AlN or InN, or a compound crystal thereof, or another composition ratio may be selected, depending on the intended use. Furthermore, a desired impurity may be added, depending on the intended use.

The lattice constant of the electron supply layer 40 is preferably equal or approximate, enough not to cause a strain, to that of the underlying layer 37. This means that no strain is applied to the second electron supply layer 40, it is not necessary to consider the critical film thickness of the second electron supply layer 40 at which transition increases.

The electron affinity of the electron supply layer 40 is preferably smaller than that of each of the second electron transit layer 38 and the first electron transit layer 39.

In the present embodiment, titanium is employed as the source electrode 43 and the drain electrode 44. The source electrode 43 and the drain electrode 44 may form an ohmic contact with a semiconductor layer to be brought into contact with the source electrode 43 and the drain electrode 44. Particularly when, n type impurities have been added to the semiconductor layer to be brought into contact with the source electrode 43 and the drain electrode 44 by ion implantation or the like during crystal growth or after crystal growth, many electrode materials form an ohmic contact. In this case, therefore, the material can be selected from a wider range. The source electrode material or the drain electrode material is however preferably unreactive or sparingly reactive with films such as semiconductor protecting films to be brought into contact with the source electrode 43 or the drain electrode 44.

In the present embodiment, the gate insulating film 18 is formed directly on the electron supply layer 40 without forming a semiconductor protecting film.

Next, manufacturing steps of the semiconductor device 300 will be described. Over a substrate 10, a buffer layer 36, an underlying layer 37, a second electron transit layer 38, a first electron transit layer 39, and an electron supply layer 40 are formed successively. In the present embodiment, stacking of from the buffer 36 to the electron supply layer 40 may be conducted using metal organic chemical vapor deposition (MOCVD). Instead, molecular beam epitaxy (MBE) may also be employed for the formation as needed.

Next, in the film stack structure thus obtained, a region from which the electron supply layer 40 and the first electron transit layer 39 have been removed is formed. This region is formed using recess etching. In the present embodiment, dry etching is used for the recess etching, but wet etching may be employed as needed. This partially removed region is designated as a gate region 301. A region of a layer deposited below the bottom surface (on the side of the substrate 10) of the gate region 301, through which layer electrons flow when the semiconductor device 300 using a nitride semiconductor is ON is designated as a channel region 302. The horizontal-direction length of the channel region 302 is made equal to the horizontal-direction length of the gate region. Since the first electron transit layer 39 has been etched completely, the position of the bottom surface of the recess in the depth direction is at the interface between the first electron transit layer 39 and the second electron transit layer 38.

An advantage of using the recess etching step is omitted here because it is similar to that of the first embodiment.

Next, a gate insulating film 18 and a gate electrode 32 are formed successively in the gate region 301.

Next, at positions on the sides opposite to each other with the gate region therebetween, a source electrode 43 and a drain electrode 44 are formed on the electron supply layer, respectively. In the present embodiment, the source electrode 43 and the drain electrode 44 are formed by vacuum deposition with an electron gun. Instead of it, they may be formed by sputtering or CVD as needed.

According to the present embodiment, almost no strain is applied to the first electron transit layer 39 and the electron supply layer 40. This is because with regard to the first electron transit layer 39, the lattice constant of GaN which is a material of the electron transit layer 39 and the lattice constant of $In_{0.13}Al_{0.87}N$ which is a material of the underlying layer 37 are approximate enough not to cause a strain. In the hetero epitaxial growth, a semiconductor layer formed over an underlying layer has a greater critical film thickness as the lattice mismatch with the underlying layer becomes smaller. Accordingly, a sufficiently small lattice mismatch (a difference of 0.2% or less in terms of a lattice constant ratio of both materials) and a sufficiently large critical film thickness (from about 10000 angstrom to 2000 angstrom) are desired to prevent occurrence of a strain. In the present embodiment, with regard to the electron supply layer 40, a compound semiconductor $In_{0.13}Al_{0.87}N$ having a same composition ratio is used for the electron supply layer and the underlying layer so that the lattice constant is equal and no strain is generated.

As a result, a first advantage available by this embodiment is an increase in the design freedom because it becomes unnecessary to consider the critical film thickness of a film to be formed when a semiconductor device to which the invention can be applied is designed. A second advantage available by this embodiment is improvement in the reliability of the semiconductor device 300 as a result of a decrease in a strain energy of the entire semiconductor device 300. A third advantage is improvement in the electron supply amount from the electron supply layer 40. Since no strain is applied to the electron supply layer 40, electron supply by piezoelectric polarization does not occur, but due to a high Al composition ratio, electron supply exceeding that available by a piezoelectric effect can be achieved only by spontaneous polarization effect.

Thus, it has been found that when a material having a lattice constant equal to or substantially equal to that of the underlying layer 37 is used for the first electron transit layer 39 and the electron supply layer 40, no strain is generated in these semiconductor films and therefore it becomes unnecessary to consider the critical film thickness at the time of forming these semiconductor films. It has also been found that no stress on these semiconductor films occurs so that the semiconductor device 300 itself has improved reliability.

A description has so far been made mainly on the principal manufacturing steps of an MIS field effect transistor using a nitride semiconductor transistor. For manufacture and integration of semiconductor devices to which the invention including the MIS field effect transistor can be applied, many steps (for example, wiring and formation of an interlayer insulating film) are necessary in addition to the above-described manufacturing steps of a semiconductor device exemplified in the above embodiments. It is possible and indispensable to carry out these steps before, after or during the steps exemplified in the embodiments of the invention.

What is claimed is:

1. A nitride semiconductor device comprising:
an underlying layer which is a nitride semiconductor;
a second electron transit layer, which is a nitride semiconductor, provided over the underlying layer;
a first electron transit layer, which is a nitride semiconductor, provided over the second electron transit layer;
an electron supply layer, which is a nitride semiconductor, provided over the first electron transit layer, a gate region provided in the electron supply layer and the first electron transit layer;
a gate insulating film provided in the gate region; and
a gate electrode provided over the gate insulating film,
wherein the lattice constant of the second electron transit layer is greater than that of the underlying layer.

2. The nitride semiconductor device according to claim 1, wherein the electron affinity of the second electron transit layer is greater than that of the underlying layer, the first electron transit layer, and the electron supply layer.

3. The nitride semiconductor device according to claim 1, wherein an $In_xGa1_{-x}N$ layer (with the proviso that x is $0 \leq x \leq 1$) includes as the second electron transit layer.

4. The nitride semiconductor device according to claim 1, wherein the thickness of each of the second electron transit layer, the first electron transit layer, and the electron supply layer is not greater than the critical film thickness at which transition increases.

5. The nitride semiconductor device according to claim 1, wherein the lattice constant of the first electron transit layer is greater than that of the underlying layer.

6. The nitride semiconductor device according to claim 1, wherein the lattice constant of the first electron transit layer and the lattice constant of the underlying layer are substantially equal to each other from the standpoint of not causing a strain.

7. The nitride semiconductor device according to claim 1, wherein the lattice constant of the electron supply layer is smaller than that of the underlying layer.

8. The nitride semiconductor device according to claim 1, wherein the lattice constant of the electron supply layer and the lattice constant of the underlying layer are substantially equal to each other from the standpoint of not causing a strain.

9. The nitride semiconductor device according to claim 1, wherein the electron affinity of the first electron transit layer is greater than the lattice constant of each of the underlying layer and the electron supply layer.

10. The nitride semiconductor device according to claim 1, comprising a GaN layer as the first electron transit layer.

11. The nitride semiconductor device according to claim 1, wherein an $Al_xGa_{1-x}N$ layer (with the proviso that x is 0≤x≤1) or an $In_xAl_{1-x}N$ layer (with the proviso that x is 0≤x≤1) which is a compound crystal of any of GaN, AlN, and InN includes as the underlying layer.

12. The nitride semiconductor device according to claim 1, wherein the bottom surface of the gate region is provided at the interface between the second electron transit layer and the first electron transit layer.

13. The nitride semiconductor device according to claim 1, wherein the bottom surface of the gate region is provided in the first electron transit layer.

14. The nitride semiconductor device according to claim 1, wherein at least one of the electron supply layer, the first electron transit layer, and the second electron transit layer has a multilayer structure obtained by stacking different materials or materials having a different composition ratio.

15. The nitride semiconductor device according to claim 2, wherein an $In_xGa1-_xN$ layer (with the proviso that x is 0≤x≤1) includes as the second electron transit layer.

16. The nitride semiconductor device according to claim 2, wherein the thickness of each of the second electron transit layer, the first electron transit layer, and the electron supply layer is not greater than the critical film thickness at which transition increases.

17. The nitride semiconductor device according to claim 3, wherein the thickness of each of the second electron transit layer, the first electron transit layer, and the electron supply layer is not greater than the critical film thickness at which transition increases.

18. The nitride semiconductor device according to claim 2, wherein the lattice constant of the first electron transit layer is greater than that of the underlying layer.

* * * * *